US006628113B2

(12) United States Patent
Gallavan

(10) Patent No.: US 6,628,113 B2
(45) Date of Patent: Sep. 30, 2003

(54) SURGE CURRENT MEASUREMENT

(75) Inventor: Michael F. Gallavan, Edmonds, WA (US)

(73) Assignee: Fluke Corporation, Everett, WA (US)

( * ) Notice: Subject to any disclaimer, the term of this patent is extended or adjusted under 35 U.S.C. 154(b) by 0 days.

(21) Appl. No.: 09/852,395

(22) Filed: May 9, 2001

(65) Prior Publication Data

US 2002/0167302 A1 Nov. 14, 2002

(51) Int. Cl.7 .............................................. G01R 19/00
(52) U.S. Cl. ................. 324/102; 324/103 R; 324/117 H
(58) Field of Search .............................. 324/117 R, 115, 324/536, 537, 158.1, 117 H, 102, 103 R, 112, 111, 119, 120; 364/483; 327/58, 62; 708/805

(56) References Cited

U.S. PATENT DOCUMENTS

| 4,333,049 A | * | 6/1982 | Yui et al. ................. 324/158.1 |
| 4,438,498 A | * | 3/1984 | Sekel et al. .............. 324/158.1 |
| 5,446,371 A | * | 8/1995 | Eccleston et al. ........... 324/115 |
| 5,790,432 A | * | 8/1998 | Morys ........................ 324/115 |
| 6,242,922 B1 | * | 6/2001 | Daum et al. ................ 324/536 |
| 6,344,747 B1 | * | 2/2002 | Lunghofer et al. ......... 324/537 |

* cited by examiner

Primary Examiner—Kamand Cuneo
Assistant Examiner—Jimmy Nguyen
(74) Attorney, Agent, or Firm—George T. Noe; Richard A. Koske

(57) ABSTRACT

A novel method of and apparatus for accurately measuring surge currents such as motor-starting inrush currents is provided. An input signal from a current sensor is monitored, and when the input signal changes and exceeds a predetermined threshold, a surge current is detected. The input signal is acquired over a predetermined time period by a fast sampling ADC, which converts the input signal into a series of digitized samples representative of instantaneous current values. These values are processed to compute average current or RMS current, which is then displayed.

10 Claims, 2 Drawing Sheets

SURGE CURRENT MEASUREMENT

BACKGROUND OF THE INVENTION

This invention relates generally to measuring electrical current, and in particular to measuring surge current.

A special form of digital multimeter known as a clampmeter includes a current sensing jaw that may be opened and placed around a wire to measure current. Conventional current clampmeters typically have a range switch for selecting a desired current range, and internal processing circuitry including a dual-slope analog-to-digital converter (ADC) for accurately measuring the value of current being measured. The final current reading is displayed on a liquid-crystal display (LCD) screen.

Accurate measurement of inrush surge current of an AC electric motor at startup would be useful because it reflects on the health of the motor, since a weak motor may draw excessive current. Conventional current clampmeters do not offer this feature.

Short duration surge currents have heretofore been extremely difficult to measure with any degree of accuracy for a number of reasons. While dual-slope ADCs provide extremely accurate measurements, particularly for DC measurements, the ADC operation is asynchronous to the surge current. Consequently, it is very difficult to capture the surge current as it occurs. Also, the measurement time of the dual-slope ADC is typically longer than the time duration of the surge current, or has dead time during which nothing is measured, resulting in faulty measurements.

For root-mean-square (RMS)—or average-responding instruments using analog detection methods, the time for the converter to respond makes such methods impractical for measuring motor inrush current. A very recently-produced current clampmeter instrument using an RMS-converter takes several seconds at lower current levels to reach final value.

It would be desirable to provide a clampmeter with an inrush current feature to measure current surges without resorting to expensive oscilloscope triggering and processing circuitry.

SUMMARY OF THE INVENTION

In accordance with the present invention, a novel method of and apparatus for accurately measuring surge currents such as motor-starting inrush currents is provided for a current-measuring instrument such as a clampmeter.

An input signal from a current sensor is monitored, and so long as the signal level is below a predetermined threshold, the display indicates that the current-measuring instrument is armed and ready to measure a surge current. When the input signal changes and exceeds the predetermined threshold, a surge current is detected, triggering the instrument, and the measurement process begins.

The input signal is acquired over a predetermined time period after the trigger point by a fast sampling ADC, which converts the input signal into a series of digitized samples representative of instantaneous current values. The absolute values of the digitized samples are accumulated (added together), and the total divided by the number of samples acquired to produce the average. The average is then formatted for display in terms of average current or RMS current, and finally displayed.

In a proposed commercial embodiment, a microcomputer with a fast ADC is utilized to carry out the measurement process. The predetermined time period is one hundred milliseconds, which is sufficient to capture and measure motor inrush current of a AC electric motor. Processing for surge current detection and sample accumulation is carried out "one the fly" on a sample-by-sample basis, so extra storage and post-acquisition processing are not needed. Once a surge current is detected, a readout of the average or RMS value is available in a fraction of a second.

Other objects, features, and advantages of the present invention will become obvious to those having ordinary skill in the art upon a reading of the following description when taken in conjunction with the accompanying drawings.

DETAILED DESCRIPTION OF THE INVENTION

Figure 1:
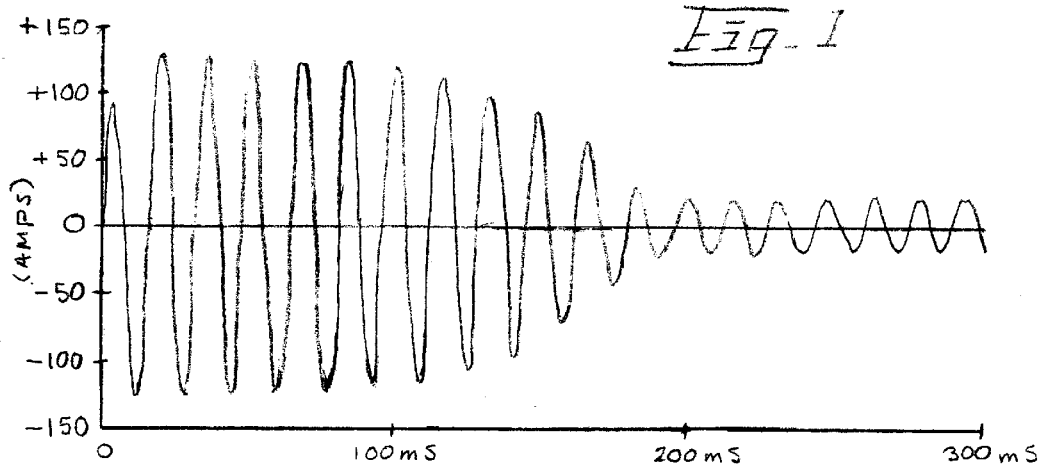
FIG. 1 is typical AC current waveform associated with startup of an electric motor.

Referring to FIG. 1 of the drawings, there is shown for purposes of understanding the invention a typical armature winding AC current waveform for a single phase three horsepower electric motor during its startup. Initially, the current in the armature winding is high as the motor overcomes its inertia and begins to rotate. In the example shown, this current varies between approximately +/−120 amperes for approximately 100 milliseconds. Then, as the motor increases its rotational speed, the current drops until the motor is running at its normal speed. Once the motor reaches its normal speed, the current in the armature winding stabilizes at a normal run rate of approximately +/−20 amperes. The high current during the first 100 milliseconds is what is referred to as inrush current, and is what will be measured by the present invention. Inrush current is typically specified for AC electric motors as about 6 to 10 times the normal operating current. Excessively high inrush current, or inrush current that increases over the life of the motor are indicators of a defective motor.

Figure 2:
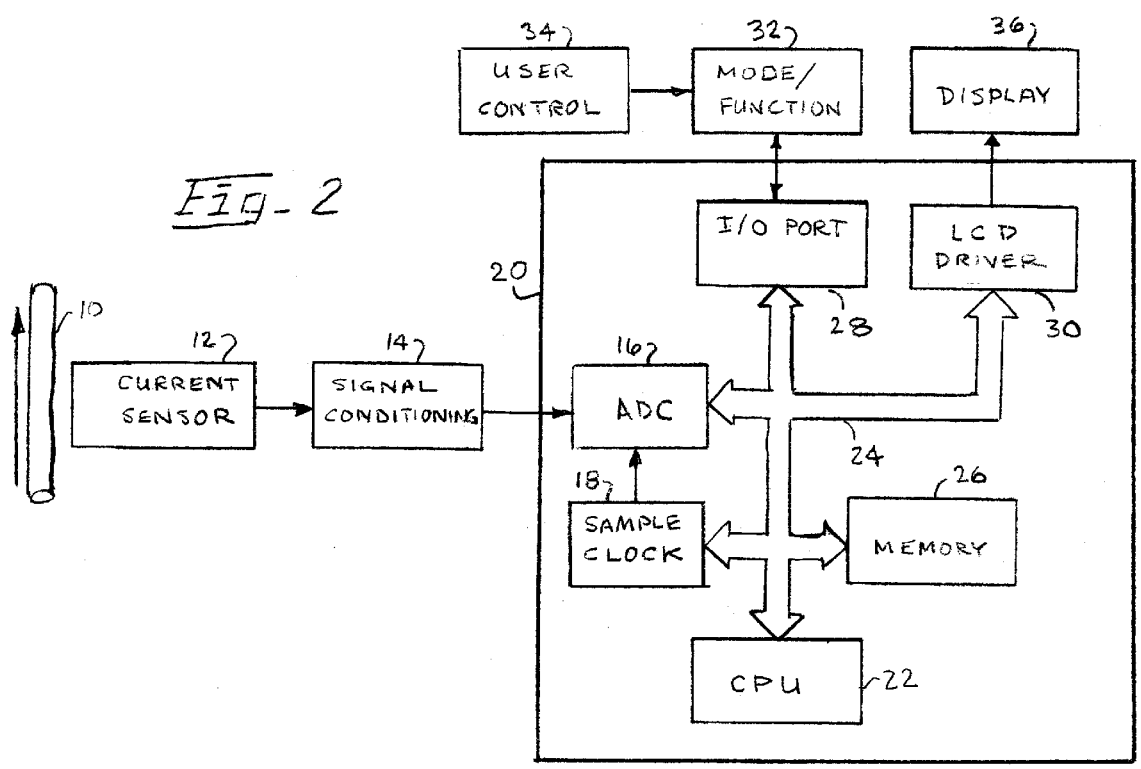
FIG. 2 is a block diagram of an exemplary circuit for measuring surge current in accordance with the present invention.

FIG. 2 is an exemplary circuit employed in a clampmeter for measuring surge current, including motor inrush current. A current-carrying conductor 10 induces current into a current sensor 12, which may suitably be any of a number of current transducers which produce voltage output proportional to a current that is sensed. Examples of such current sensors include Hall-effect devices and coils. In a proposed commercial embodiment, the current sensing device of a clampmeter may suitably comprise either a current transformer or a Hall-effect device. The clampmeter has what is known in the industry as a "jaw" that can be opened to accept a wire and then closed to encompass the wire. This type of jawed device is also known as a current clamp, and hence the instrument is known as clampmeter.

The input signal from current sensor 12 is applied to a signal conditioning circuit 14, where it may be buffered, amplified or attenuated as necessary to meet the input requirements of ADC 16. ADC 16 samples the input signal and produces digital representations of instantaneous signal values at a rate determined by sample clock 18. In this exemplary embodiment, the sample clock free runs at a four-kilohertz rate, producing a digitized sample every 250 microseconds. Also in this embodiment, ADC 16 and clock 18 are part of an integrated circuit package 20 which also includes a CPU 22 along with its associated bus structure 24, a memory 26 (both RAM and ROM), an input/output (I/O) port 28 and an LCD driver 30. Integrated circuit package 20 is an MPS4300C32 14-bit microcomputer manufactured by and commercially available from Texas Instruments.

Because the clampmeter has functions other than measuring surge or inrush currents, operating mode, function, and measurement routines are provided through the I/O port 28 to CPU 22 from a mode/function block 32 that includes suitable selector switches and firmware from which measurement routines may be selected. The mode/function block 32 in turn is controlled by user control 34, which may suitably include selection knobs and buttons on the front panel of the clampmeter.

Figure 3A:
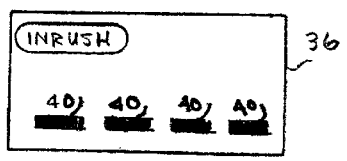
FIGS. 3A and 3B are exemplary displays showing respectively instrument status before inrush current is detected and a value of inrush current.
Figure 3B:

A liquid crystal display 36 provides alpha-numeric or digital readout of display information. Refer to FIGS. 3A and 3B for exemplary displays. Let us suppose that the user has selected the motor inrush current mode. Mode/function block 32 provides this information to CPU 22, which through LCD driver 30 places the word INRUSH on the display 36 to let the user know that the inrush mode has been selected. Before a measurement is made, CPU 22 places four segments 40 on the display as shown in FIG. 3A to let the user know that the clampmeter instrument is prepared to measure motor inrush current, but no inrush current has been detected. Once the inrush current has been detected, an alpha-numeric display is generated as shown in FIG. 3B. The value of "119A" displayed is simply selected as an example of a typical display.

Figure 4:
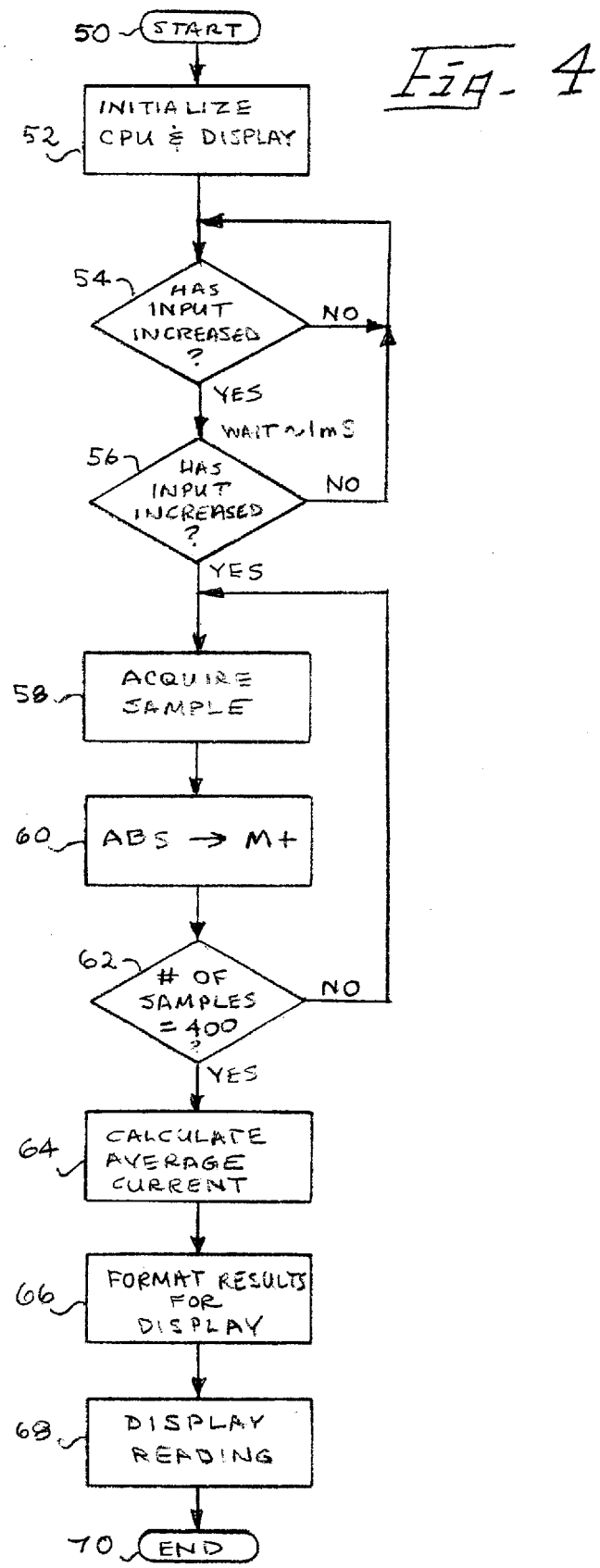
FIG. 4 is an exemplary program to explain the operation of the circuit of FIG. 2.

Operation of the circuit of FIG. 2 will be discussed in connection with the exemplary program shown in FIG. 4. Prior to initiation of the inrush current measurement, ADC 16 continuously samples the input signal under the control of free-running sample clock 18; however, nothing is done with the digitized samples until a measurement is triggered. In step 50, the inrush current measurement mode is selected to start the measurement algorithm. The program is downloaded from the firmware in mode/function block 32 to CPU 22.

In step 52, the CPU is initialized by setting a threshold level provided by the firmware. The threshold level is something above zero amperes, and may be, for example, five amperes, to ensure signal detection. The threshold level may be adjustable by a user through the user control 34 if desired to prevent false readings initiated by noise. CPU 22 also sets the initial display as shown in FIG. 3A.

In step 54, an acquired digitized sample of the input signal is compared with the threshold level. If the input has not changed from zero and does not match the threshold level, another sample is acquired and process repeated until the input signal increases from zero and matches the threshold level.

Once the input has changed, CPU 22 waits a short time period, for example, approximately 1 millisecond, and then in step 56 a newly-acquired digitized sample is compared with the previously acquired sample. If the input signal has not increased after the short time delay, it is an indication that the first digitized sample was part of a transient or spike which went away by the time the second sample was acquired. If this is the case, then CPU 22 returns to its initialized state and steps 54 and 56 are repeated until an increase in signal level is detected.

In step 58, assuming the signal level detected in step 54 has increased, it is assumed that inrush current has been detected, triggering a measurement cycle. The measurement process begins as the first of 400 digitized samples is acquired. It should be noted for this example that since the sample clock 18 causes ADC 16 to acquire a sample every 250 microseconds, 400 samples represents a stream of points over a time period of 100 milliseconds. For example, assuming that the motor inrush current is nearly sinusoidal at 60 hertz, six complete cycles of the input signal will be processed and used to compute the average value, and at 50 hertz, five complete cycles of the input signal likewise will be processed. For other time periods and sampling rates, a different number of samples may be acquired rather than the 400 used in this example; however, it is a relatively straightforward computation to determine the actual number of samples needed to complete a measurement.

In step 60, the absolute value (ABS) of the digitized sample is determined, which is analogous to full-wave rectification, and then stored in an accumulator register (M+). It should be noted that the M+ function is similar to that commonly found on calculators.

In step 62, a count of the number of samples is kept. If the number of samples is less than 400 samples for this example, the program returns to step 58 and another digitized sample is acquired and added to previously acquired samples in step 60. When the count reaches 400, a measurement period of 100 milliseconds is complete and 400 samples have been acquired and added together in the aforementioned accumulator register (M+).

In step 64, the average current value is calculated by dividing the accumulated value of 400 digitized samples by 400.

In step 66, the results are formatted for display. The AC average values or RMS values, or even an average of the DC value (the signal envelope) may be calculated as determined by the program instructions. For example, if the RMS value is desired, the average value is multiplied by a factor of 1.111.

In step 68, the inrush current is displayed.

Thereafter, the program ends as indicated by step 70.

It should be noted that ADC 16 has only 14 bits of resolution, and so apparent resolution is increased by oversampling and averaging. The increase in counts of resolution is the square root of the number of samples taken. This is achieved by using an acquisition interval of 100 milliseconds, since six full cycles of a 60-hertz AC waveform can be sampled as discussed above.

It can be readily seen that other operating modes are easily facilitated, such as peak detection, min/max, measuring true RMS and average responding RMS. True RMS can be calculated directly from the samples acquired over 100 milliseconds. By taking an average of the absolute value of an AC waveform over 100 milliseconds and multiplying by a factor of 1.11, the average responding RMS value can be calculated.

While I have shown and described the preferred embodiment of my invention, it will be apparent to those skilled in the art that many changes and modifications may be made without departing from my invention in its broader aspects. For example, it would be a relatively simple matter to acquire all of the digitized samples, store them in a separate memory, and employ post-acquisition processing to determine the value of surge currents. The trade-off, of course, is increased complexity and longer processing times. It is therefore contemplated that the appended claims will cover all such changes and modifications as fall within the true scope of the invention.

What I claim as my invention is:

1. A method of measuring surge current, comprising the steps of:
   (a) receiving an input signal from a current sensor;
   (b) detecting a change in said input signal indicating the beginning of a current surge;
   (c) acquiring said input signal for a predetermined time period following detection of said change thereby to acquire said current surge for at least a portion of its time duration;
   (d) processing said current surge to determine the numerical average thereof; and
   (e) displaying said numerical average.

2. A method of measuring surge current in accordance with claim 1, wherein said step of acquiring said input signal comprises sampling said input signal for a predetermined time period following detection of said change to acquire a series of digitized samples representative of the instantaneous magnitude of said input signal at sampled points on said input signal.

3. A method of measuring surge current in accordance with claim 2, wherein said step of processing said surge current comprises determining the absolute values of said digitized samples, accumulating said absolute values, and computing the numerical average of said absolute values.

4. A method of measuring surge current in accordance with claim 1 further comprising the step of providing a visual display indicating a ready condition before a surge current is detected.

5. A method of measuring surge current, comprising the steps of:
   (a) receiving an input signal from a current sensor;
   (b) continuously converting said input signal into digital samples representative of instantaneous current values at a predetermined rate;
   (c) comparing each of said digital samples with a predetermined value representative of a surge current, and when said predetermined value is exceeded, acquiring a series of consecutive digital samples for a predetermined time period that includes at least a portion of the time duration of said surge current;
   (d) processing said series of consecutive digital samples to provide a numerical indication of said surge current; and
   (e) displaying said numerical indication.

6. A method of measuring surge current in accordance with claim 5, wherein said step of processing said series of consecutive digital samples includes determining the absolute value of each sample, accumulating said absolute values, and calculating the numerical average of said absolute values.

7. A method of measuring surge current in accordance with claim 5 further comprising the step of providing a visual display indicating a ready condition before said predetermined value is exceeded.

8. A current measuring instrument, comprising:
   a current sensor for providing an input signal corresponding to an external current;
   means for determining when the magnitude of said input signal exceeds a predetermined trigger threshold indicating a beginning a surge current;
   a sampling analog-to-digital converter coupled to said current sensor for converting said input signal into a digitized samples representative of instantaneous magnitudes at sampled points of said input signal;
   a processor coupled to said sampling analog-to-digital converter for receiving a series of consecutive digital samples for a predetermined time period that includes at least a portion of the time duration of said surge current, said processor computing a numerical indication of said surge current; and
   a display device for displaying said numerical indication.

9. A current measuring instrument in accordance with claim 8 wherein said numerical indication is one of an average current and an RMS current.

10. A current measuring instrument in accordance with claim 8 wherein display device further provides a display indicating a ready condition before said beginning of said surge current.

* * * * *